United States Patent
Reynolds et al.

(10) Patent No.: US 11,520,949 B2
(45) Date of Patent: Dec. 6, 2022

(54) DIGITAL DESIGN OF AN AREA

(71) Applicant: INTERNATIONAL BUSINESS MACHINES CORPORATION, Armonk, NY (US)

(72) Inventors: Spencer Thomas Reynolds, Austin, TX (US); Raden Tonev, Austin, TX (US); Zachary A. Silverstein, Jacksonville, FL (US); Jeremy R. Fox, Georgetown, TX (US); Shikhar Kwatra, Durham, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 184 days.

(21) Appl. No.: 16/733,401

(22) Filed: Jan. 3, 2020

(65) Prior Publication Data
US 2021/0209261 A1 Jul. 8, 2021

(51) Int. Cl.
*G06G 7/48* (2006.01)
*G06F 30/13* (2020.01)
*G06F 30/12* (2020.01)

(52) U.S. Cl.
CPC .............. *G06F 30/13* (2020.01); *G06F 30/12* (2020.01)

(58) Field of Classification Search
CPC ................................. G06F 30/12; G06F 30/13
See application file for complete search history.

(56) References Cited

U.S. PATENT DOCUMENTS

| | | | |
|---|---|---|---|
| 9,082,047 B2 | 7/2015 | Marchesotti | |
| 9,639,957 B2* | 5/2017 | Yalniz | G06Q 30/0643 |
| 9,721,183 B2 | 8/2017 | Heller et al. | |
| 10,057,637 B2 | 8/2018 | Kellner | |
| 10,698,967 B2* | 6/2020 | Shen | G06F 16/337 |

(Continued)

FOREIGN PATENT DOCUMENTS

| | | |
|---|---|---|
| CN | 107944124 A | 4/2018 |
| CN | 109190135 A | 1/2019 |

(Continued)

OTHER PUBLICATIONS

Reuksupasompon, Peeranut, Maytichai Aruncharathorn, and Sirion Vittayakorn. "Ar development for room design." 2018 15th International Joint Conference on Computer Science and Software Engineering (JCSSE). IEEE, 2018.*

(Continued)

*Primary Examiner* — Rehana Perveen
*Assistant Examiner* — Nithya J. Moll
(74) *Attorney, Agent, or Firm* — Maeve Carpenter; Matthew M. Hulihan; Heslin Rothenberg Farley & Mesiti PC

(57) ABSTRACT

Digital design of an area is provided by obtaining input parameters for designing the area, comparing the input parameters to a design profile for the user, in which the design profile indicates user preferences regarding design elements, identifying design element(s) to be included in digital design(s) for the area based on correlating the input parameters with design element(s) from the design profile, generating the digital design(s), each of which incorporates at least one of the identified design elements, and displaying a digital design for potential selection to guide designing the area.

20 Claims, 9 Drawing Sheets

(56) References Cited

U.S. PATENT DOCUMENTS

| | | | | |
|---|---|---|---|---|
| 2005/0081161 | A1* | 4/2005 | MacInnes | G06K 9/00 715/765 |
| 2008/0281573 | A1* | 11/2008 | Seletsky | G06F 30/13 703/17 |
| 2013/0259308 | A1* | 10/2013 | Klusza | G06V 20/00 382/103 |
| 2014/0032359 | A1 | 1/2014 | Dewangan | |
| 2019/0005159 | A1* | 1/2019 | Raman | G06F 16/2428 |

FOREIGN PATENT DOCUMENTS

| | | |
|---|---|---|
| JP | 2002123721 A | 4/2002 |
| KR | 100628507 B1 | 9/2006 |

OTHER PUBLICATIONS

Sandu, Mihai, and Ileana Simona Scarlat. "Augmented Reality Uses in Interior Design." Informatica Economica 22.3 (2018): 5-13.*

Lei, Zhibin, S. Kicha Ganapathy, and Robert J. Safranek. "MIRACLE: multimedia information retrieval by analysing content and learning from examples." Proceedings Fourth IEEE Workshop on Applications of Computer Vision. WACV'98 (Cat. No. 98EX201). IEEE, 1998.*

Kim, Jin Sung, Jae Yeol Song, and Jin Kook Lee. "Approach to the extraction of design features of interior design elements using image recognition technique." (2018).*

Kemke, Christel, Richard Galka, and Monirul Hasan. "Towards an Intelligent Interior design system." Proc. Workshop on Intelligent Virtual Design Environments (IVDEs). 2006.*

Kim, Jinsung, Jaeyeol Song, and Jin-Kook Lee. "Approach to auto-recognition of design elements for the intelligent management of interior pictures." (2019).*

"IoT and AI Are Revolutionizing the Spaces Where We Live and Work", IBM, 7 pgs. Retrieved on Aug. 27, 2019 from the Internet URL: <https://www.ibm.com/internet-of-things/explore-iot/buildings/commercial-buildings>.

"IBM Creates Interior Design Solution", CRN, Apr. 11, 2006, 4 pgs. Retrieved on Oct. 21, 2019 from the Internet URL: <https://www.crn.com/features/channel-programs/185300596/IBM-creates-interiordesign-solution.htm>.

"Interior Design Market Value Worldwide From 2013 to 2021 (in million U.S. dollars)", Statista, Nov. 2017, 4 pgs. Retrieved on Aug. 27, 2019 from the Internet URL: <https://www.statista.com/statistics/899161/global-interior-design-market-value/>.

Screen captures from YouTube video clip entitled "Houzz View in My Room 3D: Meet the Team," 9 pgs., uploaded on May 3, 2017 by user "HouzzTV" at https://www.youtube.com/watch?v=NKdS9xyj6co.

"Houzz App Adds 3D Augmented Reality to Help You Shop", HOUZZ Press Info, May 3, 2017, 2 pgs.Retrieved on Jan. 2, 2020 from the Internet URL: https://www.houzz.com/press/312/Houzz-App-Adds-3D-Augmented-Reality-to-Help-You-Shop.

"Your Dream Design Is Just a Click Away", Leaperr, 13 pgs. Retrieved on Aug. 27, 2019 from the Internet URL: <https://leaperr.com/#gallery>.

Taylor, A., "How We're Democratizing Interior Design With AI and AR", Mar. 29, 2018, 5 pgs. Retrieved on Aug. 27, 2019 from the Internet URL: <https://medium.com/homestory-ar/how-were-democratizing-interior-design-with-ai-and-ar-3ca2c5dcf92b>.

Mell, Peter, et al., "The NIST Definition of Cloud Computing", NIST Special Publication 800-145, Sep. 2011, Gaithersburg, MD, 7 pgs.

* cited by examiner

DIGITAL DESIGN OF AN AREA

BACKGROUND

There are many resources available for obtaining inspiration to improve the aesthetics of a room, home, office, or other areas. Such sources of inspiration can include images of configured and designed rooms and homes. Often times these images are shared and viewed on social media platforms, enabling users of these platforms to select and save, pin, favorite, etc. these images for future reference. These saved images can later be referred to by the user when designing a room, either as part of a new setup or a renovation, rearrangement, or redesign of the room.

SUMMARY

Shortcomings of the prior art are overcome and additional advantages are provided through the provision of a computer-implemented method. The method obtains input parameters for designing an area, where at least one input parameter of the input parameters is ascertained from one or more images of the area, and where the one or more images are input by the user. The method also compares the input parameters to a design profile for the user, where the design profile for the user indicates user preferences regarding design elements. One or more design elements to be included in one or more digital designs for the area is identified from the design profile, where the one or more digital designs are to be generated for presentation to the user. This identification is based, at least in part, on the comparing correlating the input parameters with the one or more design elements from the design profile, where at least some of the one or more design elements represent physical objects to include in the area and preferences for layout of the physical objects. The method additionally generates the one or more digital designs for the area, where the generating incorporates into each digital design of the one or more digital designs a respective at least one design element of the of the identified one or more design elements. A device of the user displays a digital design of the one or more digital designs for potential selection to guide designing the area.

Further, a computer system is provided that includes a memory and a processor in communication with the memory, wherein the computer system is configured to perform a method. The method obtains input parameters for designing an area, where at least one input parameter of the input parameters is ascertained from one or more images of the area, and where the one or more images are input by the user. The method also compares the input parameters to a design profile for the user, where the design profile for the user indicates user preferences regarding design elements. One or more design elements to be included in one or more digital designs for the area is identified from the design profile, where the one or more digital designs are to be generated for presentation to the user. This identification is based, at least in part, on the comparing correlating the input parameters with the one or more design elements from the design profile, where at least some of the one or more design elements represent physical objects to include in the area and preferences for layout of the physical objects. The method additionally generates the one or more digital designs for the area, where the generating incorporates into each digital design of the one or more digital designs a respective at least one design element of the of the identified one or more design elements. A device of the user displays a digital design of the one or more digital designs for potential selection to guide designing the area.

Yet further, a computer program product including a computer readable storage medium readable by a processing circuit and storing instructions for execution by the processing circuit is provided for performing a method. The method obtains input parameters for designing an area, where at least one input parameter of the input parameters is ascertained from one or more images of the area, and where the one or more images are input by the user. The method also compares the input parameters to a design profile for the user, where the design profile for the user indicates user preferences regarding design elements. One or more design elements to be included in one or more digital designs for the area is identified from the design profile, where the one or more digital designs are to be generated for presentation to the user. This identification is based, at least in part, on the comparing correlating the input parameters with the one or more design elements from the design profile, where at least some of the one or more design elements represent physical objects to include in the area and preferences for layout of the physical objects. The method additionally generates the one or more digital designs for the area, where the generating incorporates into each digital design of the one or more digital designs a respective at least one design element of the of the identified one or more design elements. A device of the user displays a digital design of the one or more digital designs for potential selection to guide designing the area.

Additional features and advantages are realized through the concepts described herein.

BRIEF DESCRIPTION OF THE DRAWINGS

Aspects described herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
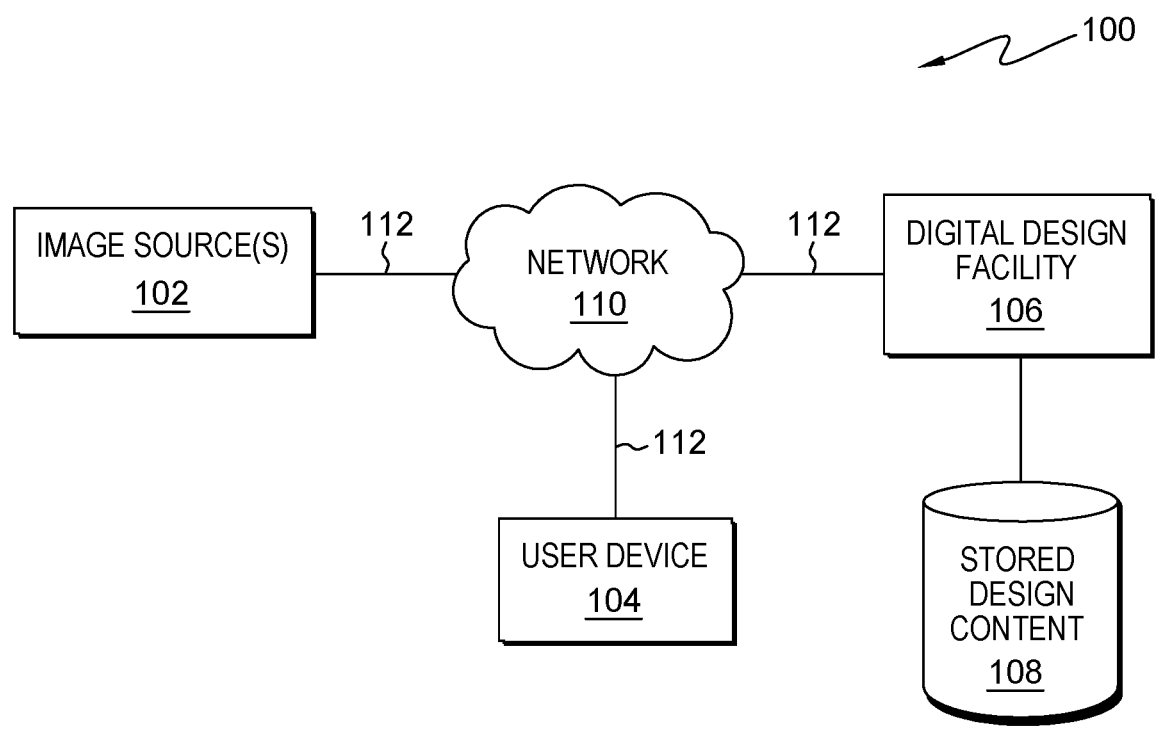
FIG. 1 depicts an example environment to incorporate and use aspects described herein.

Described herein are approaches for digitally designing an area. One or more aspects described herein can be applied to improve aesthetics of a room, home, office or any other area. As noted, some technologies allow users to refer to saved images at a later time, for instance when renovating or designing a room. However, it can be challenging for a user to translate or emulate appealing designs found in such image(s), and particularly combinations of design elements that the user likes but that are not necessarily presented together in any images that the user sees, in the user's particular physical space ("space" is interchangeably referred to herein as "area", "environment", "room", or the like).

Aspects described herein generate and display for a user digital designs of an area that incorporate user preferences from a design profile of the user. The design profile can be built at least in part using machine learning and can indicate user preferences regarding design elements. The design elements and user preferences thereof (either positive or negative, and the degree of the preference) can be ascertained from user sentiments expressed relative to digital images accessed via any of various social media platforms, mobile software applications, and/or other image sources. The design elements can be ascertained by automatically recognizing similarities and/or differences of images, and features of those images, about which the user has provided expressions of sentiment (e.g., liked/disliked, commented, shared, saved, rated, etc.). The design profile can then be used for automatically generating proposed designs for an area the user desires to be designed, subject to any applicable parameters set by the user or otherwise. Based on a user providing image(s) of an area that the user desires to be designed, various input parameter(s) (e.g. size of the area, items currently in the area, color scheme, etc.) can be ascertained from the image(s). Other input parameters, such as parameters not necessarily automatically ascertainable from the images of the area, for the design to be performed can be provided by the user, according to various embodiments. The input parameters can then be compared to the design profile of the user to identify design element(s) to be included in digital design(s) for the area. Design elements refer to any elements of a design. Example design elements include, but are not limited to, (i) the furniture and other physical objects to be included in the area, (ii) colors, patterns, styles, motifs, materials, or the like, and pairings thereof, of any physical objects to be included in the area, (iii) colors used on any walls, (iv) lighting characteristics in the area from natural light and/or lighting fixtures, and (v) layout, positioning, and/or orientation of furniture and other physical objects to be included in the area. Identification of the design elements to be included/incorporated in the generated digital designs for the area can be based, at least in part, on correlating the input parameters with design element(s) indicated by the design profile for the user. One or more digital designs for the area can be generated that incorporate at least one of the design element(s) identified for potential inclusion in the digital designs for the area. Generated digital designs can be displayed on a device, for instance a user device (i.e. a device being used by a user), for potential selection by the user to guide the user in designing the area, and specifically in implementing desired aspects of a selected generated design. For instance, according to one embodiment, the digital design(s) can be displayed via an augmented reality (AR) device, such as a smartphone or other mobile device configured to augment live images of the area with design elements of a generated digital design. AR could for example display items of furniture and/or any other physical objects that conform with aesthetic patterns or styles the user has liked on social media, and virtually position the objects within the area being designed.

Advantageously, approaches described herein can guide the user in designing a space by identifying furnishings and other design elements that the user is expected to like, and automatically virtually position them in an aesthetically pleasing manner in the user's unique space.

With reference to the figures, exemplary diagrams are provided in which illustrative aspects of the present invention may be implemented. Note in this regard that the exemplary diagrams are only exemplary and are not intended to imply any limitation with regard to the environments in which different aspects may be implemented. Many modifications to the depicted environments may be made.

Referring to FIG. 1, an example environment 100 to incorporate and use aspects described herein includes image source(s) 102. Image source(s) 102 refers to any source of images (e.g., pictures, videos, etc.). For instance, image source(s) 102 may represent one or more websites accessed through network(s) 110 by a user using a user device 104. The term 'websites' encompasses both traditional web page offerings as well as other web-application offerings, such as social networks (e.g., Facebook®, a registered trademark of Facebook, Inc., Menlo Park, Calif., U.S.A.; Pinterest®, a registered trademark of Pinterest, Inc., San Francisco, Calif., U.S.A.), image posting platforms (e.g., Instagram®, a registered trademark owned by Facebook, Inc.; Houzz®, a registered trademark of Houzz, Inc., Palo Alto, Calif., U.S.A.), e-commerce platforms (e.g., Amazon®, a registered trademark of Amazon Technologies, Inc., Seattle, Wash., U.S.A), chat platforms, and/or any other web platforms, including platforms commonly offered via mobile applications. In connection with these websites/web-application offerings, a user typically, though not always, has an 'account' or 'profile' that stores information regarding the user's use and interactions with the site or web-application. As a specific example, a user of a social network typically has a user profile encompassing or indicating personal information, posts, comments, 'likes', personal pages, etc. Permission-based access to the foregoing can be given to other users/accounts of the social network. Such a profile can be an image source as it can identify images about which the user has expressed sentiments either explicitly or implicitly. A user of a digital design facility (e.g. application or platform) presented herein may opt-in to give the design facility, such as digital design facility 106 of FIG. 1, permission to access the user's image source(s) 102, for instance the user's profile(s) on various web-based platforms, which can indicate images about which the user has express sentiments.

A user device 104 may be, for example, a computing device including, without limitation, a mobile device, cellular phone, tablet computer, personal computer, laptop computer, a device with augmented reality (AR) functionality (e.g., wearable AR device), or other computing device that may be configured to access image source(s) 102. A user device 104 can have client software installed and executed that enables the user of the device to interact across network(s) 110 with images source(s) 102. In some examples, the client software includes a web browser, in which the user navigates to a website and engages the image source(s) 102. In other examples, the client software is a mobile application or other specialized application installed on the user device.

Network(s) 110 may include one or more local area and/or wide area networks, such as the Internet.

Communication links 112 may be or include any appropriate wired or wireless communication links for communicating data, including cellular, ethernet, Wi-Fi, and/or other types of connections. Thus, in some embodiments, communication links 112 can encompass one or more local area network(s) and/or wide area network(s). Thus, in some embodiments, components form and/or communicate via one or more intervening networks over wired and/or wireless communication links.

Digital design facility 106 in FIG. 1 is or includes one or more computer systems, for instance a remote backend cloud engine, to perform aspects described herein, such as provision of a machine leaning engine, intelligent processing, and generation and/or presentation of digital designs to a user via user device 104. The digital design(s) can be stored as stored design content to a database, file server(s), a public or private cloud storage service platform, etc. represented by stored design content 108 in FIG. 1.

Digital design facility 106 can guide a user in designing an area. In some examples, source images about which users have expressed sentiments can be copied and stored to the stored design content 108. Additionally, or alternatively, indications of user sentiment regarding those images and/or design elements thereof could be stored to stored design content 108. Moreover, design profiles of users could be stored as part of the stored design content 108. FIG. 1 is just one example of an environment to incorporate and use aspects described herein; many other examples are possible and contemplated as being compatible with the capabilities described herein.

Figure 2:
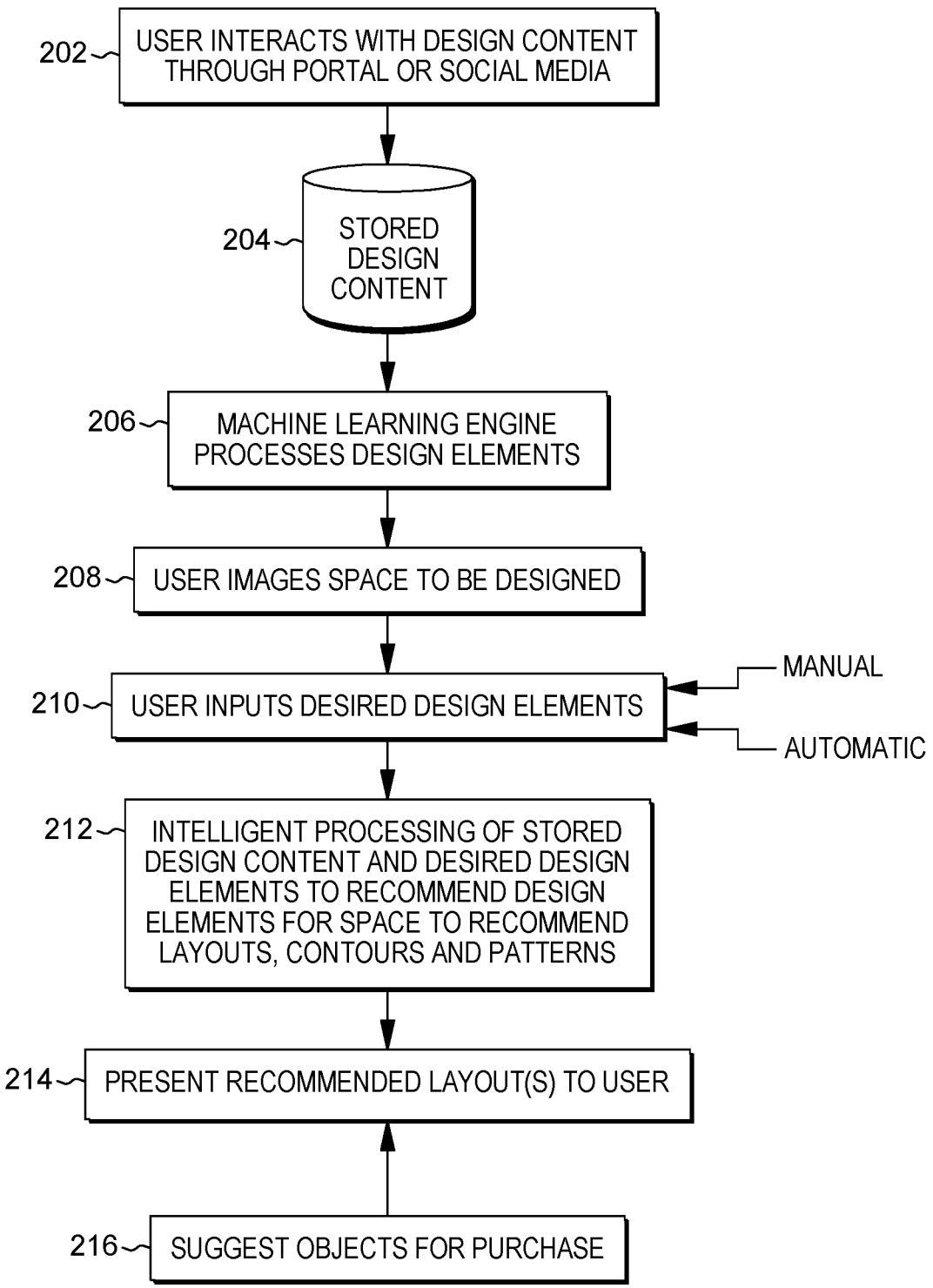
FIG. 2 depicts a conceptual overview of digitally designing an area, in accordance with aspects described herein.

Referring to FIG. 2, a conceptual overview of digitally designing an area is shown. Aspects of FIG. 2 can be performed by a digital design facility implemented by one or more computer system(s), such as cloud or remote backend systems, user device(s), and/or a combination of the foregoing.

At 202, a user interacts with design content through a portal, social media, or the like. For instance, the user uses a user interface/browser to access and browse images on image source(s) 102. A user may view one or more digital images on a social media platform, mobile application, or other image source, and provide an expression of sentiment about the image(s) and/or one or more aspects of the image(s). According to various embodiments, a user may provide an indication that the user likes/dislikes the image(s). For example, a user may comment about, share, swipe the image(s) in a designated direction, post, like, rate, etc. image(s) being viewed. Further, an expression of sentiment can be determined via natural language processing (NLP) techniques to understand a comment made by the user about one or more images. In some examples, the digital design facility is given access to the user's profile/account in order to learn of the user's activity relative to the viewed images.

According to one embodiment, at least some aspects of the image(s) about which a user has expressed sentiment can be ascertained from the digital image(s). For instance, a computer vision (CV) mechanism can determine from the image(s) one or more design elements of the image(s) about which the user expressed sentiment. In one example, the CV mechanism can identify design elements such as aesthetic pattern(s), style(s), item(s), positioning, spacing, proportions, color palette(s), motif(s), material(s), brand(s), objects, etc. The user may express sentiment about whole image(s), one or more regions of the image(s), and/or specific design elements presented in image(s).

According to one or more aspects, the CV mechanism can execute image feature extraction against images and correlate identified features to the aforementioned expressions of user sentiment in order to identify user preferences. An identification representing user preferences can be saved as stored design content 204, for instance in the design profile for the user. Optionally, records or other indications of the user's expressions of sentiment, for instance the actual comments made, the likes or favorites indicated, and so on, can be stored as part of the stored design content. Further, images about which user sentiments were expressed, or indications of those images (for instance links to the images), can be retained in the stored design content, if desired. According to one embodiment, the foregoing can be stored in the stored design content 204 as, or as part of, a design profile for the user, where the design profile at least indicates user preferences regarding one or more design elements.

At 206, a machine leaning engine processes design elements, including those identified in the stored design content along with user sentiment. One aspect of this processing can be to learn user preferences for design elements and combinations thereof. This can be a continual learning process based not only on the user's continued interaction with images from image sources and expression of sentiment regarding those images, but also based on feedback from the user about digital designs that are generated and proposed to the user, as described below. Additionally, the machine learning can be based on such user data across any number of users. That is, model(s) to identify sentiments about design features and combinations thereof based on user behavior relative to viewed images, and to predict user sentiment about particular designs and design elements, can be trained using user data from any number of users of the digital design facility.

As noted, the machine learning is an ongoing process. As the user provides more similar expressions of user sentiment towards digital images with common design elements, the system may assign a high confidence score to specific design elements of the design profile. For example, the design facility may determine that if the space to be designed is a home office (as indicated via an input parameter to the design facility), the user often (e.g., 75% of the time) expresses positive sentiment towards L-shaped desks in home office settings to conserve space. Alternatively, the system might determine that if the area to be designed is a large, at-work office, the user often (e.g., 90% of the time) expresses positive sentiment towards a straight desk positioned in the middle of the room. The system might also determine that the user often (e.g., 80% of the time) expresses negative sentiment towards desks made from wood materials regardless of the setting (e.g., home office, at-work office, etc.). Depending on the number of times the user has expressed sentiment towards common design elements, and whether the confidence score is based on positive or negative expressions of sentiment, the confidence score may be generated. In some examples, the confidence score may be inconclusive and/or need more data points in order to generate a confidence score for certain design elements. These confidence scores may contribute to creating (building and maintaining) the design profile of the user. Once created, the design profile can later be used in the generation of one or more digital designs for an area.

At 208, the user images a space to be designed. For example, the user uses a camera or other imaging device to capture image(s) of an area, which may or may not include existing furniture or other design elements. The user, by way of a device, provide the images of the area to the digital design facility. Various forms of mobile device applications can be used, for instance. The user may upload photograph(s) taken from different angles and/or video(s) of the area to provide the one or more images. Imaging the space to be designed can be used by the design facility to create a digital map of the area to be designed.

At 210, the user inputs desired design elements into the design engine/facility. Desired design elements can refer to different design elements that the user does, and/or does not, desire to be included in generated digital designs of the area. The user's input regarding desired design elements are example design parameters to be accounted-for by the design facility and potential integration into the digital designs to be generated.

An automatic aspect to this input can be the automated identification of design elements, for instance furniture, that is known to be desired/included in proposed designs for the space, and/or known to be undesired for proposed designs for the space. The user could have prespecified what existing elements of the area and appearing in the images should or should not be retained in proposed designs, for example. As another example, the system could automatically perform feature extraction to extract one or more features from one or more input images of the area the user intends to design. The feature extraction could extract one or more features from which the system ascertains one or more input parameters, such as the size of the room to be designed, item(s) of furniture currently in the room and to be obtained, and/or any other items of interest (e.g., fireplace, window, doorway, etc.) or design elements.

There may additionally or alternatively be a manual aspect to this input, for instance by way of the user manually indicating design elements that should or should not be included. The system could receive a user input manually provided by a user. The user could manually provide a user input such as an intended use for the area after the area is designed. The intended use may inform furniture design elements to be included in the one or more digital designs to be generated. In other examples, the user may manually input a design style that the one or more digital designs for the area are to incorporate as part of the generation of the one or more digital designs. Other user inputs manually provided can include one or more specific physical objects that are presented in at least one of the one or more images of the area and that are to be represented in the generated digital designs for the area, and/or one or more desired types of physical objects to be represented in the generated digital designs for the area. For example, user input could indicate items of furniture currently in the room that should be included in one or more digital designs, items of furniture not currently in the room that the user wants or does not want to be included in the digital design, etc. The user could markup image(s) of the area to indicate inclusion, deletion, or movement of design elements, for instance by drawing a red 'X' over a piece of furniture that the user wants to update/replace in the room to be designed. In some aspects, the user can explicitly indicate design elements, whether or not already present in the area, that are to be included in proposed designs for the area. For example, the user could indicate possessed (or to-be-procured) furniture or room decorations that should be included in proposed designs. Such indicated user desires as to design elements are included as part of the 'input parameters' for designing the area.

At 212 the digital design facility performs intelligent processing of stored design content and desired design elements based on the input parameters and the machine learning (206) to recommend design elements for the area. This can include recommendations as to which objects to include, the layout of those objects, contours, patterns, colors, etc. for design(s) that the user is predicted to like. As part of this, the facility could propose how the user might utilize combinations of existing furnishings and items the user might purchase to create a new, well-designed space based on the preferences ascertained form the user's 'inspiration images', i.e. those from the image sources.

The intelligent processing leverages the machine learning engine 206. The digital design facility can deploy computer vision (for instance the openly-available OpenCV offering) with a Region with Convolution Neural Network (R-CNN) algorithm to identify design elements, analyze properties (contours, texture, size, color, arrangement, etc.) of the elements, and confidently predict, based on user sentiments, the user's preferences. Feature extraction can identify design elements in images that the user has liked or expressed some other sentiment. A pixel-by-pixel tracing can be performed to identify patterns that typically include characteristic information of the object(s) included in the images. Features from images of design elements that the user indicated that the user likes can be extracted and identified. Fabric patterns, styles, forms, shapes, motifs, etc. express characteristic information because they have ascertainable characteristics about them. A stripe pattern, for example, has visually-identifiable characteristics about the thickness of the stripes, spacing between them, colors used, etc.

A R-CNN algorithm can be used to perform a correlation of identified design elements with catalogs or remote back-end database(s) to determine how the identified elements correlate to saved preferences of the user. For example, the user may have expressed positive sentiments with respect to an image with a design element that is then correlated to other image(s) saved to a design profile that also include the design element. Through machine learning engine 206, a confidence in such correlations between design elements can be established. The machine learning engine 206 may be used to build catalog(s) of various design element(s) and user sentiment(s) towards these design element(s), which is then incorporated into the design profile of the user. In addition, user actions such as sharing images with those design elements, positively commenting specifically on certain design elements in an image, and other actions can serve to boost the sentiment rating of a particular design element, i.e. indicating that it is particularly well-liked by the user. R-CNN is used as a non-limiting example; various other algorithms may be used as would be known to one having ordinary skill in the art.

As part of a computer vision algorithm, the digital design facility can deploy the following image feature extraction mechanism, as just one example, for analysis of visual context of a region of interest and then correlate the image feature extracted to user preferences using, e.g., a Text and Image information based Convolutional Neural Network (TI-CNN) correlation. The following pseudocode is provided as an example:

```
import indicoio
indicoio.config.api_key = 'YOUR_API_KEY'
# single furniture example
indicoio.analyze_image("<FURN_IMAGE>", apis=["image_features", "fer"])
# batch example
indicoio.analyze_image([
"<FURN_IMAGE1>",
"<FURN_IMAGE2>"
], apis=["image_features", "fer"])
```

In particular examples, the system uses TI-CNN using NLP and/or one-to-one/many mapping to identify whether the user selects (via the input parameters) to use only existing furnishings, use a combination of existing and new furnishings, or use only new furnishings in building the proposed designs. This can be useful information when interpreting feedback provided to the cloud engine, as which design elements, from a proposed digital design, the user desired to keep and/or remove when actually implementing a design in the area can provide insight into the user's preference for those design elements.

Intelligent processing 212, e.g., artificial intelligence, can compare the input parameters to the design profile for a user, indicating user preferences regarding various design elements. The comparison of the one or more input parameters to the stored design content 204 can be used to determine a correlation between the input parameters, providing parameters that guide the design of the area, and design elements that the user is confidently predicted to like in this context.

The intelligent processing can identify, based on these correlations, the design elements to be included in one or more digital designs for the area. Some such design elements can represent physical object(s) to be included in the area, as well as preference(s) for layout of those physical object(s) in the area. For example, the intelligent processing may determine that the design profile indicates the user's repeatedly-expressed positive sentiment towards a specific style of furniture (e.g., rustic furniture). The intelligent processing can determine that, based on the design parameters, the specific style of furniture would correlate with furniture or other elements currently presented in the images of the area to be designed and desired by the user to be retained in proposed designs (e.g., the rustic furniture would look good in the cabin the user is designing and with the area rug the user desired to retain on the floor of the room).

Additionally or alternatively, the intelligent processing could also customize the correlation based on the intended use for the area to be designed. For example, the design profile of the user may indicate a high confidence score that the user likes a specific style of furniture (e.g., rustic furniture). If the system learns based on analyzing the input images of the area to be designed or from a user-provided input parameter, for instance, that the area to be designed is a beach house, it may conclude that the rustic style of furniture would not correlate well with the area being designed (e.g., a beach house). Such conclusion may additionally or alternatively be drawn based on identifying objects currently located in the space (e.g., tropical themed objects tend not to go well with rustic objects), intended use (e.g., user manually indicates it is a beach house), color scheme (e.g., vibrant colors), etc. In various embodiments, the intelligent processing may determine that the user likes a specific item of furniture (e.g., a floor lamp) but only if the specific item of furniture is positioned next to another specific item of furniture (e.g., an arm chair). This is an example of a correlation between design elements, where a collection of design elements might be favorably received by a user when used together but perhaps not when they are used individually. Several other variations of design elements and the identification of appropriate design elements to use in different contexts are possible.

According to various embodiments, the correlation derived based on comparing the design parameters to the user's design profile may require that a certain threshold of confidence or positive user sentiment about a design element be satisfied in order to indicate the design element for inclusion in any of the one or more digital designs to be generated and proposed. For example, the intelligent processing may require that the design profile indicate at least a 60% confidence that the user will like a certain design element in the area to be designed and as presented in the context of given digital design(s). In other embodiments, the correlation may be based on the highest correlation of specific design elements relative to other design elements. For example, the intelligent processing may determine that there is only a 10% chance that the user may like a specific item in a specific space to be designed, but the 10% chance is high relative to the 1% chance that the user would like other design elements in the specific space to be designed. Various other weighted schemes are possible.

Other embodiments of intelligent processing may account for standardized values for one or more design elements. For example, based on indications generally provided by users, a standard confidence score may exist as an original confidence score that is then modified based on the design profile of the user and/or the input parameters. In one example, if the area to be designed is a bedroom, then the standard confidence score may indicate 95% of users want digital designs that include a bed (regardless of whether the design profile of the user actually has recorded user sentiments specific to particular beds). Continuing with this example, the intelligent processing may then incorporate one or more aspects derived from the design profile of the user as one or more design elements in the bedroom such as, for instance, an ascertained user preference that the user tends to like wood furniture generally, and would likely prefer a wood headboard for the bed, rather than a fabric headboard that might typically have a higher standard confidence score for headboards.

The intelligent processing thus identifies one or more design elements for inclusion in one or more digital designs for the area. The design facility can generate and present one or more digital designs for the area on this basis. According to one embodiment, each digital design generated may include at least one design element of the identified one or more design elements. In other words, while various design elements appropriate for the area can be identified, it is not necessarily true that all such design elements will be incorporated into each proposed digital design. For instance, certain identified design elements might go very well with some identified design elements, but extremely poorly with other design elements. As another example, the identifying may have identified two alternative throw rugs for the area, where using both rugs in a design would be undesired.

Each digital design can also arrange the physical object design elements in the area to be designed. For instance, one digital design may include a television mounted on a wall above a fireplace. Another digital design may also include a television, but the television may be positioned along a different wall from the fireplace and on a television stand. Various arrangements may be possible depending on the area to be designed, the identified design elements, and the input parameters for the design.

Continuing with FIG. 2, at 214 the one or more digital designs are presented to the user as recommended layout(s) of design elements. According to one embodiment, several different digital designs may be generated. Because of this, the designs can be prioritized for presentation to the user. The prioritization may be based on a confidence score that is a function of the level of confidence the system has that a user will like a design, the predicted degree to which the user is expected to like the design, or a combination of the two. A digital design that the intelligent processing determines is most likely to be preferred by the user could be presented as the first digital design to the user. If the user likes the first digital design generated and presented, then the other digital designs may or may not be presented to the user. Alternatively, the user may review several generated digital designs to see which digital design the user likes the most. According to one embodiment, the user may be prompted to indicate what the user likes and/or does not like about a particular generated digital design. Based on feedback received from the user, the intelligent processing may generate one or more additional digital designs to be provided to the user.

As one example of feedback, the user may indicate that the user desires a particular design element present in a generated digital design to remain in a next generated digital design. In another example, the user may indicate that a next generated digital design should include everything included in the previous digital design generated except for one or more particular design elements the user does not want included. In other embodiments, the user may want a next generated digital design to change one or more characteristics of one or more design elements, for instance color or placement of a particular physical item, of a displayed digital design. As the user provides these various indications, the machine learning engine 206 may modify the confidence score that certain design elements should or should not be included in future digital designs. It can also be used in training and refining the machine learning models being used.

Another example of feedback can include the user providing updated images of the area after the user has implemented a design of the area, regardless of whether the design is based on a digital design proposed to the user. For example, the user may implement one or more aspects of a selected digital design in designing the area, and then upload updated images of the area after this design. The updated images inform the digital design facility as to what design elements the user actually implemented in the area. This can be useful to the machine learning engine in training the model(s) that model the user preferences and/or generate digital designs. Whether the user actually implemented selected design element(s) in the area can help refine the design profile of the user. Deviations from a selected design can indicate a stronger user preference (i.e. in favor of the deviation) as compared to what was originally presented in the selected digital design. Further, the updated images can be used in the generation of additional digital designs that incorporate some or all such deviations.

Additionally, feedback in the form of one or more user indications may also inform the machine learning engine to modify a standardized confidence score that may exist for certain design elements. For instance, the standardized confidence score regarding headboards for beds may initially be the highest (e.g., that 75% of users prefer a certain design element) for fabric, tufted headboards. However, based on the feedback, the machine learning engine can modify the standardized confidence score over time as fewer people express positive sentiment(s) toward fabric, tufted headboards and other styles become more popular. For example, according to one embodiment, the standardized confidence score may also be derived based on crowdsourcing images found on social media platforms and general user expressions of sentiment regarding these images. Certain images on social media may be repeatedly shared and/or saved by users in general due to certain design trends, which may influence the standardized confidence score and therefore predicted individual user preferences about these trends. According to one embodiment, the standardized confidence score may also be modified based on geographic location. For example, certain design elements may be predominant for certain geographic locations but may not be popular in other geographic locations.

According to various embodiments, recommended digital design(s) may be presented to the user via augmented reality while the user is located in the area being designed. For example, the design elements of the digital design can be presented in augmented reality on the user device as the user images the area using the device. In accordance with aspects described herein, such an augmented reality device may be configured to allow the user to browse a variety of configurations and provide input about the generated and presented digital designs until the user finds a digital design with which the user is satisfied. Augmented reality can provide a template, e.g., via three-dimensional (3D) modeling, to help the user place furnishings or other physical objects in an aesthetically pleasing manner unique to the area in the live images shown on the user's device. Additionally or alternatively, the digital designs could be presented in an augmented reality manner by modifying the original images of the area that were provided by the user at 208 to include design elements of the digital design.

Augmented reality can automatically position a physical object in an area being designed based on measurements of the area automatically ascertained from the user images provided by the user. In other examples, an augmented reality presentation can provide a drag and drop feature that permits the user to move an object being visually represented via AR from one location in the area to another location in the area.

As noted, the recommended digital design(s) may, according to various embodiments, incorporate existing design elements, including furnishings and/or other physical objects identified in an uploaded user image of the area, into the one or more digital designs. Various embodiments may also reposition or rearrange existing furnishings and/or other physical objects to meticulously position these existing objects in a manner determined to be most aesthetically pleasing for the user. Design elements of a digital design can represent physical objects currently in the area ascertained from the provided user images and also convey the proposed placement of those physical objects in the area as part of the digital design. Additional digital designs can present a repositioning of at least some of the represented physical objects in the area being digitally designed.

Further, as feedback (for instance provided as images of the area after redesigns thereof) regarding arrangement and positioning of design elements received, the machine learning can incorporate user preferences regarding object arrangement into the design profile of the user. The machine learning can recognize changes to design elements and arrangement thereof based on seasonal preferences and/or user habits, and incorporate these aspects into the design profile of the user. By way of specific example, based on feedback received from the user, the machine learning incorporates holiday décor into the recommended digital designs for certain seasons. In another example, the machine learning recognizes that the user periodically or frequently changes design element arrangement as a matter of habit. Other examples can include changes to arrangement of one or more design elements at a business storefront in order to showcase periodic sales, seasonal décor, etc. Many arrangement variations are possible, and feedback regarding these practices can be useful in building and maintaining the user's design profile, and in influencing subsequent digital design for the user.

In accordance with additional aspects described herein, recommended digital designs can incorporate physical objects determined to have been purchased, or designated to be purchased, by the user but not yet placed in the area to be designed. For example, a user may indicate, as a user input parameter, a particular physical object that has been purchased but not yet delivered. The generation of one or more digital designs can incorporate the particular physical object that has been purchased. In another example, a user may grant the system access to an e-commerce purchase history, for instance in the form of a browsing history, access to order confirmation emails or other messages, etc., based on which the system can identify recently purchased items and/or items in a virtual shopping cart to be incorporated into one or more digital designs.

Further, according to various embodiments, one or more purchasable object(s) may be presented 216 as part of the recommended layout(s) 214. For instance, the intelligent processing may browse items available for purchase that include or are design element(s) to be included in one or more digital designs. As an example, store websites, inventory stores, and/or other forms of e-commerce database(s) may be searched as part of the intelligent processing to identify purchasable object(s) to include in one or more digital designs. The identified objects can be ones that the user is expected to like, based on the design profile built for the user. In one example, intelligent processing may catalog purchasable object(s) and then determine which purchasable object(s) correlate with input parameters and are consistent with what the user is expected to like, given the design profile, in order to include those purchasable object(s) as design elements in digital designs. In another example, the intelligent processing may first identify types of design elements to be included in one or more digital designs, and then search e-commerce database(s) to find purchasable object(s) that satisfy parameters required for the design elements. According to various embodiments, digital designs can link to purchase such objects. Example links include hyperlinks to a product listing at an e-commerce website from which the user can purchase the product.

Other embodiments may include purchasable object(s) identified to be sold by nearby stores. For example, the intelligent processing can determine that purchasable object(s) satisfying the one or more design elements are in stock at a store physically/geographically near (within a threshold) the user. Other suggestions for purchasable object(s) may be incorporated by the intelligent processing based on various partnerships or agreements for recommending purchasable products.

Figure 3A:
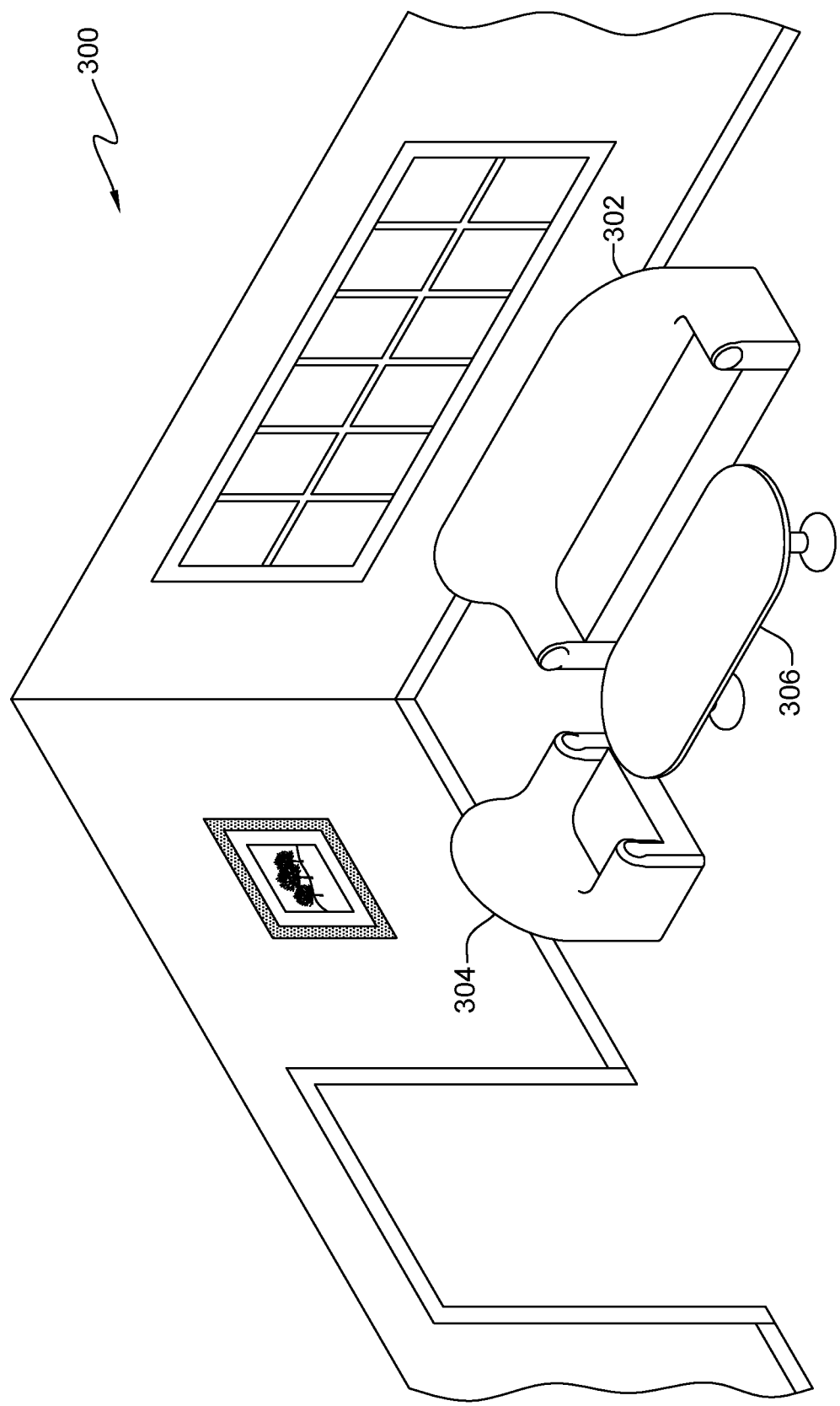
FIG. 3A depicts an example area to be designed, in accordance with aspects described herein.
Figure 3B:
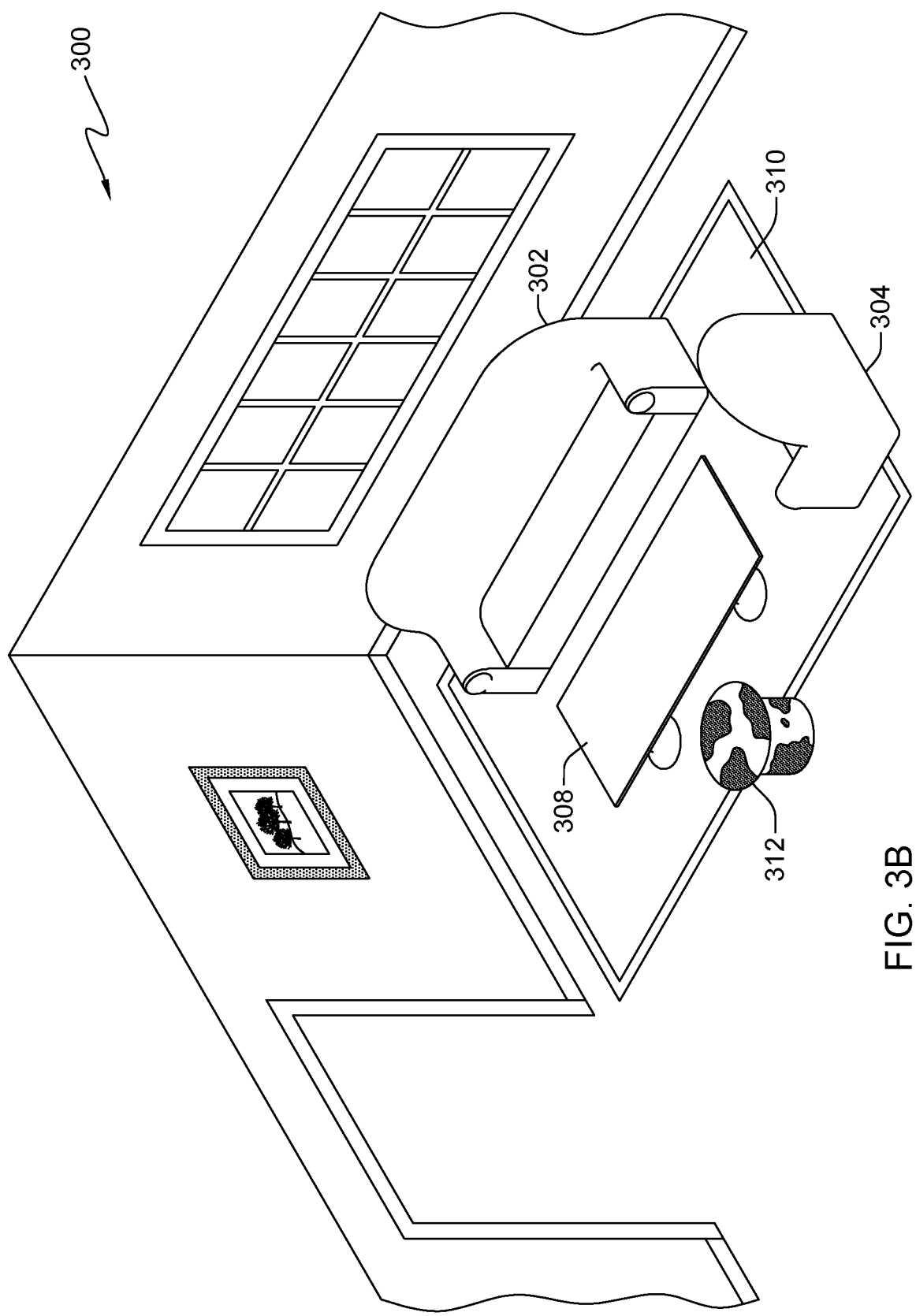
FIG. 3B depicts the area of FIG. 3A after a user has designed the area pursuant to a digital design generated and presented to the user in accordance with aspects described herein.

FIGS. 3A and 3B collectively depict a design of an area. FIG. 3A depicts an area 300 before the design, and FIG. 3B depicts the area of FIG. 3A after a user has designed the area pursuant to a digital design generated and presented to the user in accordance with aspects described herein. Referring to FIG. 3A, area 300 includes, among other elements, a couch 302, chair 304, and coffee table 306. A user uses a camera or other imaging device to capture image(s) of the area 300, the existing furniture thereof and furniture placement, and other existing design elements of the area. The user provides the images to the digital design facility. Input parameters can be ascertained from the image(s), which can include indication(s) of parameters such as, for example, size of the area, and color(s), material(s), style(s), etc. currently used. The user could also manually provide the system with input parameters, which can include indication(s) of design element(s) such as, for example, couch 302 and chair 304 that the user wants to include in digital designs to be generated. The user can also provide input parameters of design element(s) such as, for example, oval coffee table 306 that the user does not want to include in the digital designs. Some or all such input parameters are correlated with user preferences such as sentiments regarding coffee tables and other furniture that the user is expected to like in this context. The user may have expressed positive sentiment towards social media images of rectangular accent tables, and cow-hide patterns in this particular example The user's design profile is accessed and identify design element(s), for instance arrangement of furniture, a replacement rectangular coffee table, a cow-hide patterned ottoman, an area rug, etc. are identified as being complementary with design element(s), such as couch 302 and chair 304, that the user has indicated should be included in the generated digital designs. Digital designs can then be generated that incorporate some or all of these design elements.

The design element(s), and more generally a generated digital design, can be virtually displayed, for example, via AR glasses or other device while the user views the area. Graphical overlays, feature removal, pixel color manipulation, and other modifications can convey the digital design to the user based on some of the source images that the user provided of the area prior to the design and/or live images the user provides as part of an AR display of the digital design. For instance, pursuant to a generated design, chair 304 can be virtually repositioned to be near an opposite side of couch 302, a replacement rectangular coffee table can be overlaid over the oval coffee table 306, an area rug can be virtually depicted in the area, and/or other design elements can be displayed. Additionally, and/or alternatively, the design element(s) can be overlaid on a digital image uploaded to the digital design facility, displayed as part of a virtual representation of the area, projected onto the area, etc. Design element(s) that are physical object(s) displayed on the device can be representative cut-out(s) of the images/graphics of the physical object(s), hologram(s), or other virtual three-dimensional models. Any other desired digital design representation method could be used.

FIG. 3B depicts the area of FIG. 3A after the user has designed the area 300 pursuant to a digital design, in accordance with aspects described herein. In this example, the user has followed and implemented a generated and presented design that repositions chair 304 to be near an opposite side of couch 302. The user has also removed oval coffee table 306, and replaced it with rectangular coffee table 308, and added area rug 310 as well as ottoman 312.

In some examples, the user uploads updated image(s) of the area 300 to provide feedback to inform the digital design facility what design elements the user actually implemented in the area. The machine learning engine can then refine the user's design profile to indicate that design element(s) were incorporated by the user. In accordance with aspects described herein, the machine learning engine may use the indication that the user liked the cow-hide ottoman to increase confidence score(s) for design element(s) for ottoman(s), cow pattern, animal-hide material, circular accent furniture, a black and white color scheme, etc. and/or lower confidence score(s) for other design element(s) that were in digital design(s) generated and displayed to the user but not actually implemented by the user (e.g., an antique floor lamp).

Figure 4A:
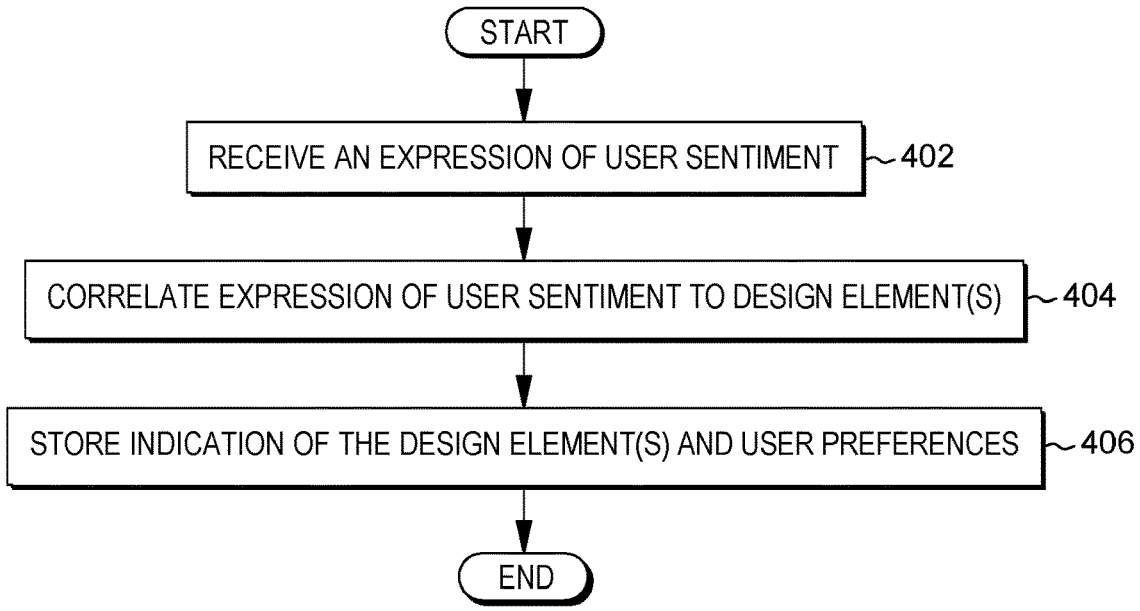
FIG. 4A depicts an example process for creating a design profile for a user, in accordance with aspects described herein.

FIG. 4A depicts an example process for creating a design profile for a user, in accordance with aspects described herein. In some examples, the process is performed by one or more computer systems, such as a digital design facility described herein, which may include one or more computer systems in communication with a database and/or one or more other computer systems. The process receives (402) an expression of user sentiment about a digital image being displayed to the user. For example, the digital image being displayed to the user can be accessed via social media platform(s). According to one embodiment, at least some of the design elements about which user preferences are indicated in the design profile of the user are ascertained from digital images about which the user has expressed sentiments. The process correlates (404) the expression of user sentiment to at least one design element of the digital image being displayed. Based on the correlating, the process stores (406) to the design profile an indication of the at least one design element of the digital image being displayed and a user preference as to that at least one design element.

Figure 4B:
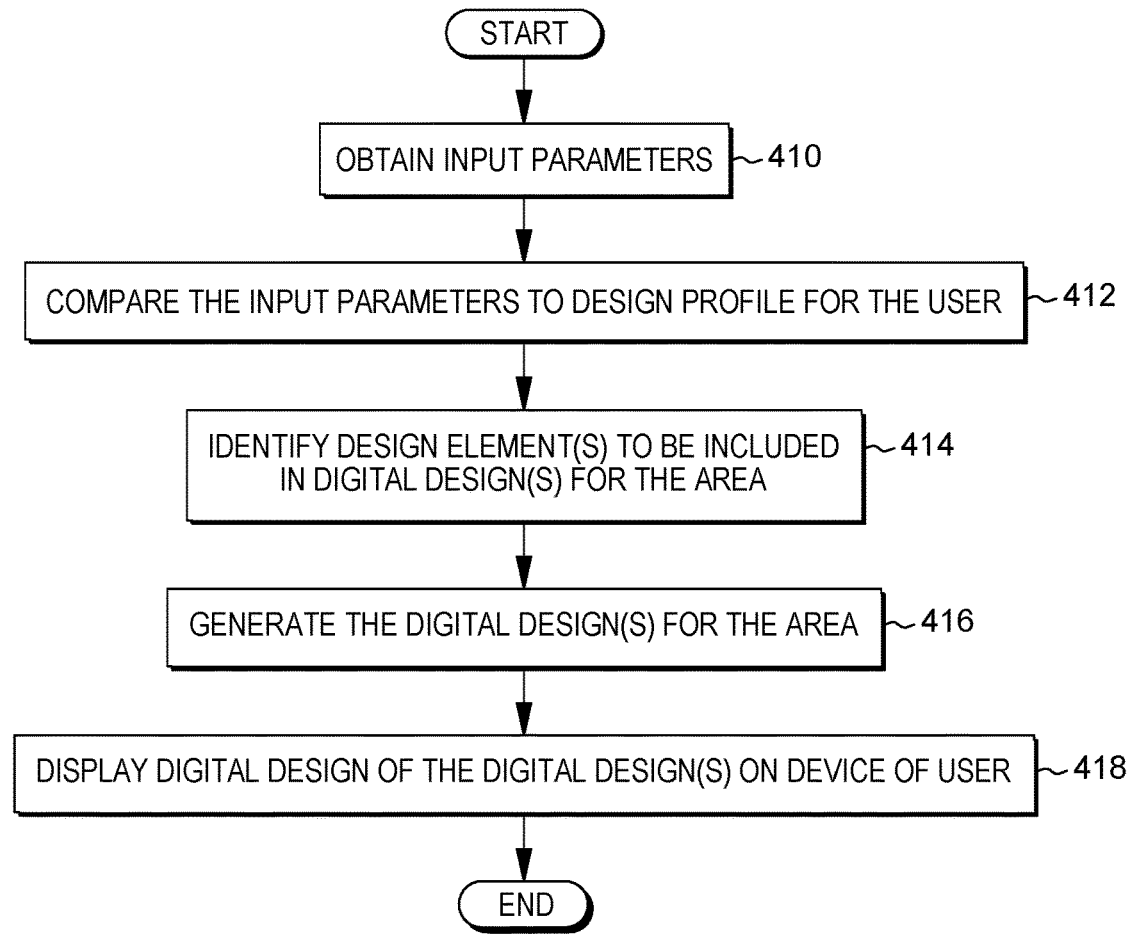
FIG. 4B depicts an example process for digitally designing an area, in accordance with aspects described herein.

FIG. 4B depicts an example process for digitally designing an area, in accordance with aspects described herein. In some examples, the process is performed by one or more computer systems, such as a digital design facility described herein, which may include one or more data processing systems in communication with a database and/or one or more other computer systems.

The process begins by obtaining (410) input parameters for designing an area. At least one input parameter of the input parameters is ascertained from one or more images of the area, where the one or more images are input by the user. In this regard, the process can receive these one or more images of the area and perform feature extraction on at least one such image to extract feature(s) from which the at least one input parameter of the input parameters is ascertained. Feature extraction can identify size of the area, existing design elements present in the area, and other features, some or all of which could inform parameters for proposed designs of the area. Additionally or alternatively, other user input can provide other input parameters. For instance, the user could input indication(s) of (i) an intended use of the area after the area is designed, the intended use informing furniture design elements to be included in the generated one or more digital designs for the area, (ii) a design style which the generated one or more digital design for the area are to follow, (iii) one or more specific physical objects that are presented in at least one of the one or more images of the area and that are to be represented in the generated one or more digital designs for the area, and/or (iv) one or more desired types of physical objects to be represented in the generated one or more digital designs for the area, as examples.

The process compares (412) the input parameters to a design profile for the user. The design profile of the user indicates user preferences regarding design elements. The process then identifies (414), from the design profile, one or more design elements that are to be included in one or more digital designs for the area. The one or more digital designs are to be generated for presentation to the user. The identifying of the design elements is based, at least in part, on the comparing (412) correlating the input parameters with the one or more design elements from the design profile. Additionally, at least some of the one or more design elements represent physical objects to include in the area and preferences for layout of the physical objects. The process generates (416) the one or more digital designs for the area, in which the generating incorporates into each digital design of the one or more digital designs a respective at least one design element of the identified one or more design elements. The process also displays (418) digital design(s) on a device of the user. The display design(s) are selectable by the user to guide designing the area. In a particular example, displaying a digital design on the device of the user includes presenting design elements of the digital design in augmented reality on the device as the user images the area using the device.

As part of the digital design generation and display, the process could select a physical object that is available for purchase by the user, where the physical object embodies a design element of the digital design, and display the physical object to the user as part of displaying the digital design. Such selection of the physical object can be based on applying one or more user-provided constraints to filter a collection of physical objects available for purchase and identify the physical object.

In a particular example, design elements of a digital design represent physical objects in the area, and the process generates and displays for the user another digital design, the another digital design presenting a repositioning of at least some of the represented physical objects in the area.

Figure 4C:
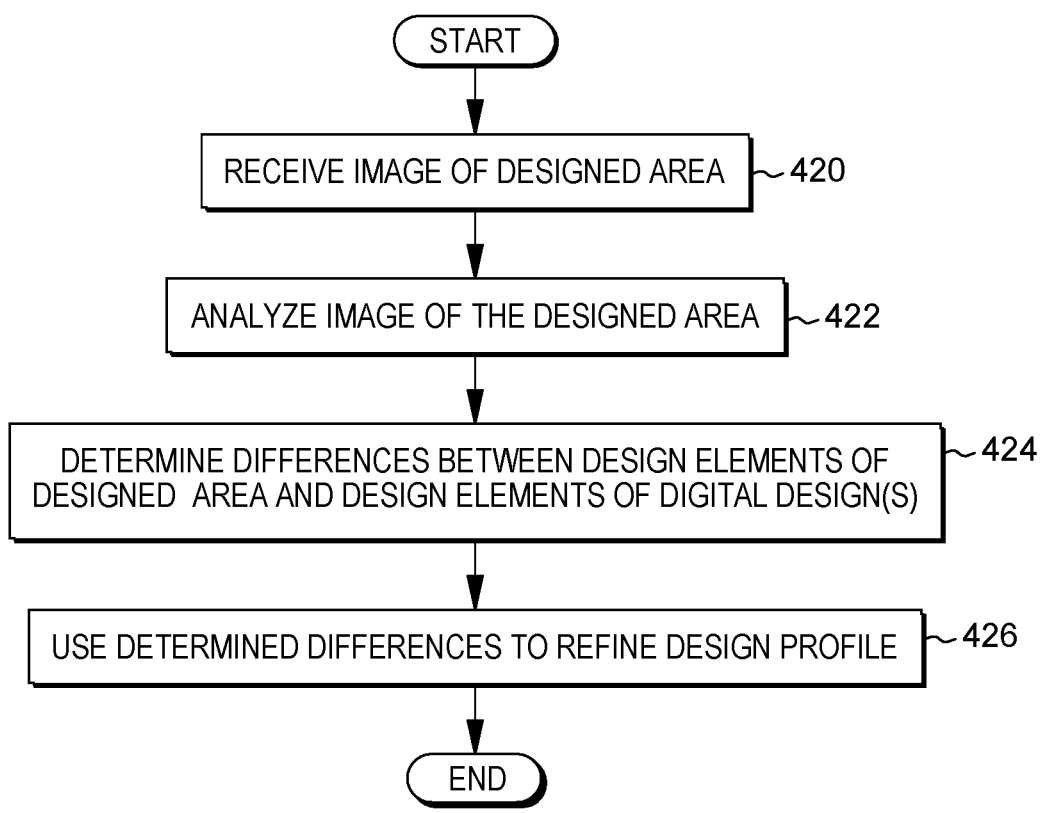
FIG. 4C depicts an example process for refining the design profile of the user, in accordance with aspects described herein.

FIG. 4C depicts an example process for refining the design profile of the user, in accordance with aspects described herein. In some examples, the process is performed by one or more computer systems, such as a digital design facility described herein, which may include one or more computer systems in communication with a database and/or one or more other computer systems. The process receives (420), based on the user designing the area, an image of the designed area depicting the area after the designing. The process analyzes (422) the image of the designed area. The process determines (424) differences between design elements of the designed area and design elements of at least one digital design of the generated one or more digital designs. The process refines (426), using the determined differences, the design profile of the user by updating the user preferences indicated by the design profile.

Although various examples are provided, variations are possible without departing from a spirit of the claimed aspects.

Figure 5:
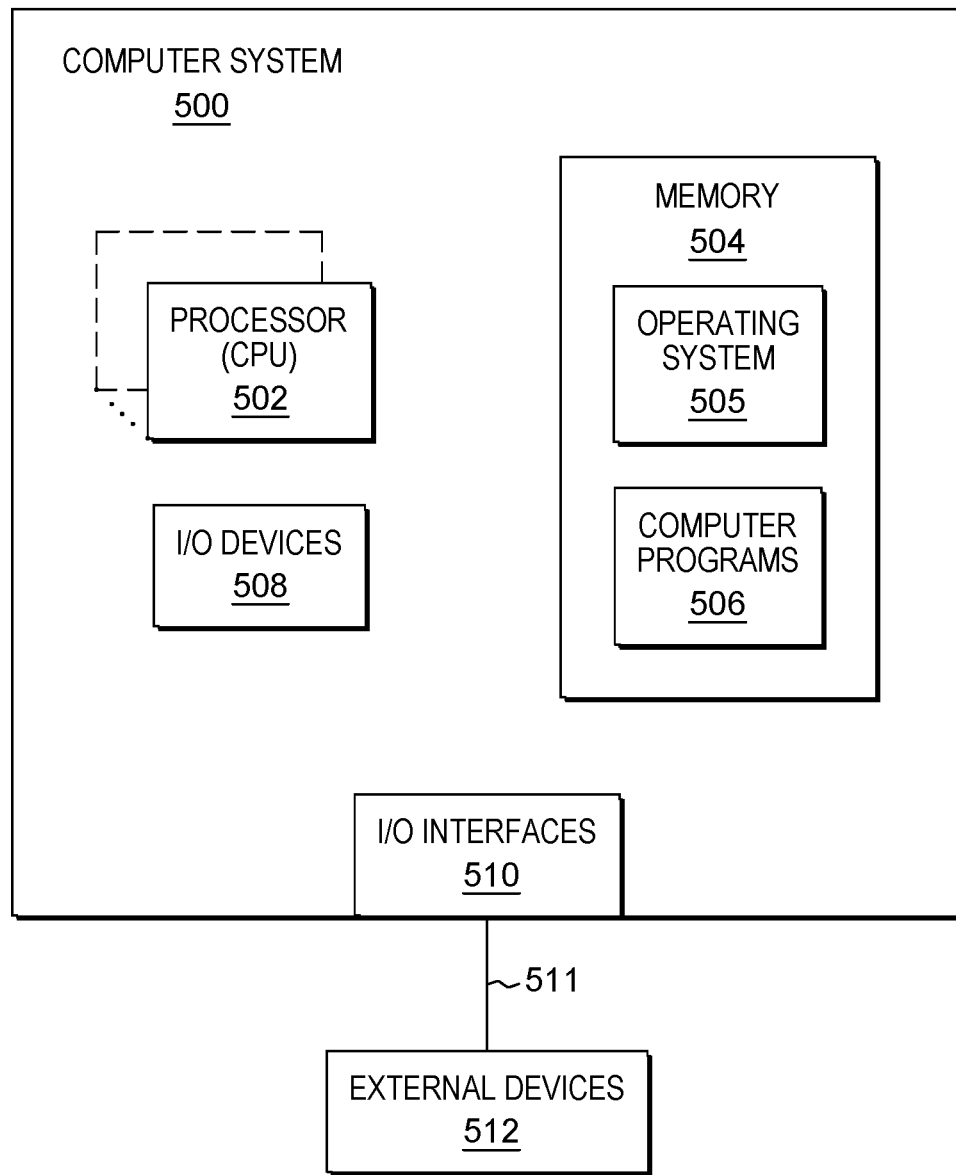
FIG. 5 depicts one example of a computer system and associated devices to incorporate and/or use aspects described herein.

Processes described herein may be performed singly or collectively by one or more computer systems, such as one or more indexers, query servers, and/or one or more other computer systems, as examples. FIG. 5 depicts one example of such a computer system and associated devices to incorporate and/or use aspects described herein. A computer system may also be referred to herein as a data processing device/system, computing device/system/node, or simply a computer. The computer system may be based on one or more of various system architectures and/or instruction set architectures, such as those offered by International Business Machines Corporation (Armonk, N.Y., USA), Intel Corporation (Santa Clara, Calif., USA) or ARM Holdings plc (Cambridge, England, United Kingdom), as examples.

FIG. 5 shows a computer system 500 in communication with external device(s) 512. Computer system 500 includes one or more processor(s) 502, for instance central processing unit(s) (CPUs). A processor can include functional components used in the execution of instructions, such as functional components to fetch program instructions from locations such as cache or main memory, decode program instructions, and execute program instructions, access memory for instruction execution, and write results of the executed instructions. A processor 502 can also include register(s) to be used by one or more of the functional components. Computer system 500 also includes memory 504, input/output (I/O) devices 508, and I/O interfaces 510, which may be coupled to processor(s) 502 and each other via one or more buses and/or other connections. Bus connections represent one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 504 can be or include main or system memory (e.g. Random Access Memory) used in the execution of program instructions, storage device(s) such as hard drive(s), flash media, or optical media as examples, and/or cache memory, as examples. Memory 504 can include, for instance, a cache, such as a shared cache, which may be coupled to local caches (examples include L1 cache, L2 cache, etc.) of processor(s) 502. Additionally, memory 504 may be or include at least one computer program product having a set (e.g., at least one) of program modules, instructions, code or the like that is/are configured to carry out functions of embodiments described herein when executed by one or more processors.

Memory 504 can store an operating system 505 and other computer programs 506, such as one or more computer programs/applications that execute to perform aspects described herein. Specifically, programs/applications can include computer readable program instructions that may be configured to carry out functions of embodiments of aspects described herein.

Examples of I/O devices 508 include but are not limited to microphones, speakers, Global Positioning System (GPS) devices, cameras, lights, accelerometers, gyroscopes, magnetometers, sensor devices configured to sense light, proximity, heart rate, body and/or ambient temperature, blood pressure, and/or skin resistance, and activity monitors. An I/O device may be incorporated into the computer system as shown, though in some embodiments an I/O device may be regarded as an external device (512) coupled to the computer system through one or more I/O interfaces 510.

Computer system 500 may communicate with one or more external devices 612 via one or more I/O interfaces 510. Example external devices include a keyboard, a pointing device, a display, and/or any other devices that enable a user to interact with computer system 500. Other example external devices include any device that enables computer system 500 to communicate with one or more other computing systems or peripheral devices such as a printer. A network interface/adapter is an example I/O interface that enables computer system 500 to communicate with one or more networks, such as a local area network (LAN), a general wide area network (WAN), and/or a public network (e.g., the Internet), providing communication with other computing devices or systems, storage devices, or the like. Ethernet-based (such as Wi-Fi) interfaces and Bluetooth® adapters are just examples of the currently available types of network adapters used in computer systems (BLUETOOTH is a registered trademark of Bluetooth SIG, Inc., Kirkland, Wash., U.S.A.).

The communication between I/O interfaces 510 and external devices 512 can occur across wired and/or wireless communications link(s) 511, such as Ethernet-based wired or wireless connections. Example wireless connections include cellular, Wi-Fi, Bluetooth®, proximity-based, near-field, or other types of wireless connections. More generally, communications link(s) 511 may be any appropriate wireless and/or wired communication link(s) for communicating data.

Particular external device(s) 512 may include one or more data storage devices, which may store one or more programs, one or more computer readable program instructions, and/or data, etc. Computer system 500 may include and/or be coupled to and in communication with (e.g. as an external device of the computer system) removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media.

Computer system 500 may be operational with numerous other general purpose or special purpose computing system environments or configurations. Computer system 500 may take any of various forms, well-known examples of which include, but are not limited to, personal computer (PC) system(s), server computer system(s), such as messaging server(s), thin client(s), thick client(s), workstation(s), laptop(s), handheld device(s), mobile device(s)/computer(s) such as smartphone(s), tablet(s), and wearable device(s), multiprocessor system(s), microprocessor-based system(s), telephony device(s), network appliance(s) (such as edge appliance(s)), virtualization device(s), storage controller(s), set top box(es), programmable consumer electronic(s), network PC(s), minicomputer system(s), mainframe computer system(s), and distributed cloud computing environment(s) that include any of the above systems or devices, and the like.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 6:
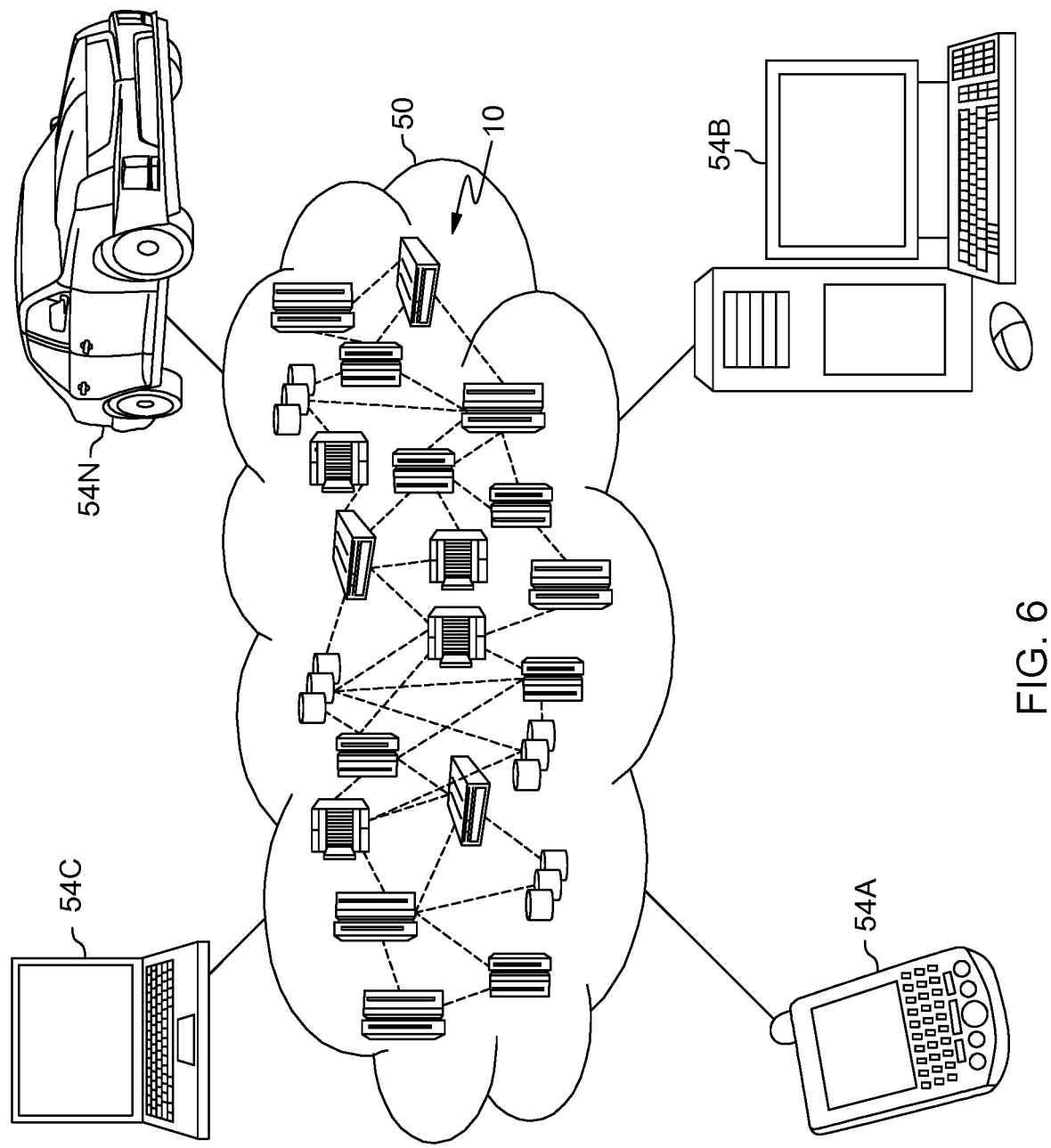
FIG. 6 depicts a cloud computing environment according to an embodiment of the present invention.

Referring now to FIG. 6, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Figure 7:
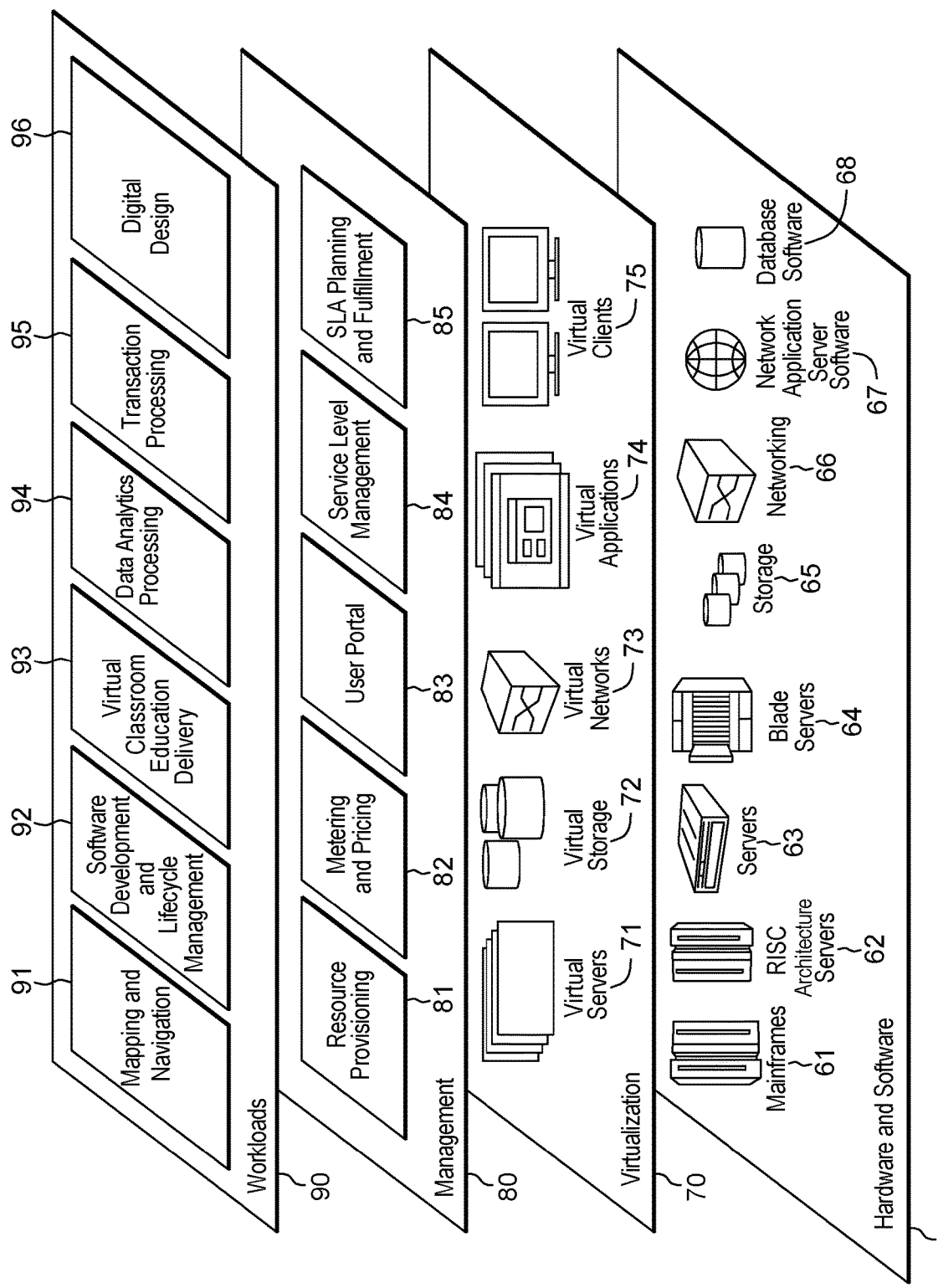
FIG. 7 depicts abstraction model layers according to an embodiment of the present invention.

Referring now to FIG. 7, a set of functional abstraction layers provided by cloud computing environment 50 (FIG. 6) is shown. It should be understood in advance that the components, layers, and functions shown in FIG. 7 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and digital design 96.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method comprising:
obtaining input parameters for designing a room, the designing comprising selecting objects and positions thereof for the room, wherein at least one input parameter of the input parameters is ascertained from one or more images of the room, the one or more images input by the user;
automatically comparing the input parameters to a design profile for the user, the design profile for the user indicating user preferences regarding design elements and the design profile being built and obtained based on machine learning;
automatically, using artificial intelligence processing, identifying, from the design profile, design elements to be included in one or more digital designs for the room, the one or more digital designs to be automatically generated for presentation to the user, wherein the identifying is based, at least in part, on the comparing correlating the input parameters with the one or more design elements from the design profile, and wherein the identified design elements comprise physical objects and preferences for layout of the physical objects in the room;
automatically, using the artificial intelligence processing, generating the one or more digital designs for the room, wherein the generating incorporates into each digital design of the one or more digital designs a respective at least one of the physical objects, and further determines a position and arrangement of the respective at least one of the physical objects, wherein the determined position and arrangement comprises a reposition of an identified physical object, of the respective at least one of the physical objects, relative to a current position of the identified physical object in the room; and
displaying a digital design of the one or more digital designs for potential selection to guide designing the room, the displaying presenting, in augmented reality on the device of the user as the user images the room using the device, design elements, of the digital design, in the room, wherein the artificial intelligence processing comprises at least one selected from the group consisting of:
a Region with Convolution Neural Network (R-CNN) algorithm to identify the design elements, analyze properties of the design elements, and confidently predict, based on user sentiments, the user's preferences; and
a Text and Image Information based Convolutional Neural Network (TI-CNN) using national language processing (NLP) to determine the user's preferences for the design elements.

2. The method of claim 1, wherein at least some of the design elements about which user preferences are indicated in the design profile are ascertained from digital images about which the user has expressed sentiments, the sentiments comprising positive sentiments and negative sentiments, and wherein the method further comprises determining and assigning, as part of the user preferences, confidence scores to specific design elements, a confidence score determined and assigned to a specific design element indicating a confidence in sentiment of the user toward a specific design element in a specific setting or scenario.

3. The method of claim 2, further comprising:
receiving an expression of user sentiment about a digital image being displayed to the user;
correlating the expression of user sentiment to at least one design element of the digital image being displayed; and
based on the correlating, storing to the design profile an indication of the at least one design element of the digital image being displayed and a user preference as to that at least one design element, including a confidence score in sentiment of the user toward the at least one design element in a specific setting of that digital image.

4. The method of claim 1, further comprising:
receiving the one or more images of the room; and
performing feature extraction on at least one image of the received one or more images, the feature extraction extracting one or more features from which the at least one input parameter of the input parameters is ascertained.

5. The method of claim 1, further comprising receiving a user input to be included as an input parameter of the input parameters, wherein the user input is an indication of at least one selected from the group consisting of:
- an intended use of the room after the room is designed, the intended use informing furniture design elements to be included in the generated one or more digital designs for the room;
- one or more specific physical objects that are presented in at least one of the one or more images of the room and that are to be represented in the generated one or more digital designs for the room; and
- one or more desired types of physical objects to be represented in the generated one or more digital designs for the room.

6. The method of claim 1, further comprising:
- selecting a physical object that is available for purchase by the user, the physical object being an object incorporated into the digital design; and
- displaying the physical object to the user as part of displaying the digital design.

7. The method of claim 6, wherein the selecting the physical object is based on applying one or more user-provided constraints to filter a collection of physical objects available for purchase and identify the physical object.

8. The method of claim 1, further comprising:
- based on the user designing the room, receiving an image of the designed room depicting the room after the designing, wherein the user designing the room comprises a rearrangement of objects in the room relative to the displayed digital design;
- analyzing the image of the designed room and determining differences between design elements of the designed room and design elements of the displayed digital design, the differences including the rearrangement; and
- using the determined differences to refine the design profile of the user by updating the user preferences indicated by the design profile.

9. The method of claim 1, wherein the artificial intelligence processing comprises the R-CNN algorithm.

10. The method of claim 1, wherein the artificial intelligence processing comprises the TI-CNN using NLP.

11. A computer system comprising:
- a memory; and
- a processor in communication with the memory, wherein the computer system is configured to perform a method comprising:
  - obtaining input parameters for designing a room, the designing comprising selecting objects and positions thereof for the room, wherein at least one input parameter of the input parameters is ascertained from one or more images of the room, the one or more images input by the user;
  - automatically comparing the input parameters to a design profile for the user, the design profile for the user indicating user preferences regarding design elements and the design profile being built and obtained based on machine learning;
  - automatically, using artificial intelligence processing, identifying, from the design profile, design elements to be included in one or more digital designs for the room, the one or more digital designs to be automatically generated for presentation to the user, wherein the identifying is based, at least in part, on the comparing correlating the input parameters with the one or more design elements from the design profile, and wherein the identified design elements comprise physical objects and preferences for layout of the physical objects in the room;
  - automatically, using the artificial intelligence processing, generating the one or more digital designs for the room, wherein the generating incorporates into each digital design of the one or more digital designs a respective at least one of the physical objects, and further determines a position and arrangement of the respective at least one of the physical objects, wherein the determined position and arrangement comprises a reposition of an identified physical object, of the respective at least one of the physical objects, relative to a current position of the identified physical object in the room; and
  - displaying a digital design of the one or more digital designs for potential selection to guide designing the room, the displaying presenting, in augmented reality on the device of the user as the user images the room using the device, design elements, of the digital design, in the room, wherein the artificial intelligence processing comprises at least one selected from the group consisting of:
    - a Region with Convolution Neural Network (R-CNN) algorithm to identify the design elements, analyze properties of the design elements, and confidently predict, based on user sentiments, the user's preferences; and
    - a Text and Image Information based Convolutional Neural Network (TI-CNN) using national language processing (NLP) to determine the user's preferences for the design elements.

12. The computer system of claim 11, wherein at least some of the design elements about which user preferences are indicated in the design profile are ascertained from digital images about which the user has expressed sentiments, the sentiments comprising positive sentiments and negative sentiments, and wherein the method further comprises determining and assigning, as part of the user preferences, confidence scores to specific design elements, a confidence score determined and assigned to a specific design element indicating a confidence in sentiment of the user toward a specific design element in a specific setting or scenario.

13. The computer system of claim 12, wherein the method further comprises:
- receiving an expression of user sentiment about a digital image being displayed to the user;
- correlating the expression of user sentiment to at least one design element of the digital image being displayed; and
- based on the correlating, storing to the design profile an indication of the at least one design element of the digital image being displayed and a user preference as to that at least one design element, including a confidence score in sentiment of the user toward the at least one design element in a specific setting of that digital image.

14. The computer system of claim 11, wherein the method further comprises:
- receiving the one or more images of the room; and
- performing feature extraction on at least one image of the received one or more images, the feature extraction extracting one or more features from which the at least one input parameter of the input parameters is ascertained.

15. The computer system of claim 11, wherein the method further comprises receiving a user input to be included as an input parameter of the input parameters, wherein the user input is an indication of at least one selected from the group consisting of:
- an intended use of the room after the room is designed, the intended use informing furniture design elements to be included in the generated one or more digital designs for the room;
- one or more specific physical objects that are presented in at least one of the one or more images of the room and that are to be represented in the generated one or more digital designs for the room; and
- one or more desired types of physical objects to be represented in the generated one or more digital designs for the room.

16. A computer program product comprising:
a computer readable storage medium readable by a processing circuit and storing instructions for execution by the processing circuit for performing a method comprising:
- obtaining input parameters for designing a room, the designing comprising selecting objects and positions thereof for the room, wherein at least one input parameter of the input parameters is ascertained from one or more images of the room, the one or more images input by the user;
- automatically comparing the input parameters to a design profile for the user, the design profile for the user indicating user preferences regarding design elements and the design profile being built and obtained based on machine learning;
- automatically, using artificial intelligence processing, identifying, from the design profile, design elements to be included in one or more digital designs for the room, the one or more digital designs to be automatically generated for presentation to the user, wherein the identifying is based, at least in part, on the comparing correlating the input parameters with the one or more design elements from the design profile, and wherein the identified design elements comprise physical objects and preferences for layout of the physical objects in the room;
- automatically, using the artificial intelligence processing, generating the one or more digital designs for the room, wherein the generating incorporates into each digital design of the one or more digital designs a respective at least one of the physical objects, and further determines a position and arrangement of the respective at least one of the physical objects, wherein the determined position and arrangement comprises a reposition of an identified physical object, of the respective at least one of the physical objects, relative to a current position of the identified physical object in the room; and
- displaying a digital design of the one or more digital designs for potential selection to guide designing the room, the displaying presenting, in augmented reality on the device of the user as the user images the room using the device, design elements, of the digital design, in the room, wherein the artificial intelligence processing comprises at least one selected from the group consisting of:
  - a Region with Convolution Neural Network (R-CNN) algorithm to identify the design elements, analyze properties of the design elements, and confidently predict, based on user sentiments, the user's preferences; and
  - a Text and Image Information based Convolutional Neural Network (TI-CNN) using national language processing (NLP) to determine the user's preferences for the design elements.

17. The computer program product of claim 16, wherein at least some of the design elements about which user preferences are indicated in the design profile are ascertained from digital images about which the user has expressed sentiments, the sentiments comprising positive sentiments and negative sentiments, and wherein the method further comprises determining and assigning, as part of the user preferences, confidence scores to specific design elements, a confidence score determined and assigned to a specific design element indicating a confidence in sentiment of the user toward a specific design element in a specific setting or scenario.

18. The computer program product of claim 17, wherein the method further comprises:
- receiving an expression of user sentiment about a digital image being displayed to the user;
- correlating the expression of user sentiment to at least one design element of the digital image being displayed; and
- based on the correlating, storing to the design profile an indication of the at least one design element of the digital image being displayed and a user preference as to that at least one design element, including a confidence score in sentiment of the user toward the at least one design element in a specific setting of that digital image.

19. The computer program product of claim 16, wherein the method further comprises:
- receiving the one or more images of the room; and
- performing feature extraction on at least one image of the received one or more images, the feature extraction extracting one or more features from which the at least one input parameter of the input parameters is ascertained.

20. The computer program product of claim 16, wherein the method further comprises receiving a user input to be included as an input parameter of the input parameters, wherein the user input is an indication of at least one selected from the group consisting of:
- an intended use of the room after the room is designed, the intended use informing furniture design elements to be included in the generated one or more digital designs for the room;
- one or more specific physical objects that are presented in at least one of the one or more images of the room and that are to be represented in the generated one or more digital designs for the room; and
- one or more desired types of physical objects to be represented in the generated one or more digital designs for the room.

* * * * *